(12) United States Patent
Desu et al.

(10) Patent No.: US 6,316,055 B1
(45) Date of Patent: Nov. 13, 2001

(54) NEAR-ROOM TEMPERATURE THERMAL CHEMICAL VAPOR DEPOSITION OF OXIDE FILMS

(75) Inventors: Seshu B. Desu, Amherst, MA (US); John J. Senkevich, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/302,938

(22) Filed: Apr. 30, 1999

(Under 37 CFR 1.47)

Related U.S. Application Data

(60) Provisional application No. 60/083,891, filed on May 1, 1998.

(51) Int. Cl.[7] ................................................ C23C 16/40
(52) U.S. Cl. ........................... 427/255.28; 427/255.6; 438/763; 438/780; 438/785; 438/790
(58) Field of Search ........................ 427/255.28, 255.6; 438/763, 780, 785, 790

(56) References Cited

U.S. PATENT DOCUMENTS 5,302,555  *  4/1994  Yu .
5,352,487  * 10/1994  Klinedinst et al. .
6,086,679  *  7/2000  Lee et al. .

OTHER PUBLICATIONS

Lee, J. "Transport Polymerization of Gaseous Intermediates and Polymer Crystals Growth", J. Macromol. Sci.–Rev. Macromol. Chem., C16(1), 79–127 (1977–78), no month available.*

* cited by examiner

*Primary Examiner*—Timothy Meeks
(74) *Attorney, Agent, or Firm*—Fliesler, Dubb, Meyer & Lovejoy

(57) ABSTRACT

This invention discloses methods for the deposition of $SiO_2$ and other oxide dielectric materials using a near room temperature thermal chemical vapor deposition process. The films have chemical, physical, optical, and electrical properties similar to or better than those of oxide films deposited using conventional, high temperature thermal CVD methods. The films of the invention are useful in the manufacture of semiconductor devices of sub-micron feature size and for food packaging.

14 Claims, 5 Drawing Sheets

NEAR-ROOM TEMPERATURE THERMAL CHEMICAL VAPOR DEPOSITION OF OXIDE FILMS

This application claims the benefit of U.S. Provisional Application No. 60/083,891, filed May 1, 1998.

BACKGROUND OF THE INVENTION

1. Field of the Invention

This invention relates to products comprising oxide films where low temperature deposition is needed. The low-temperature oxide films are used in the manufacture of semiconductor devices and in the food packing industry. The invention relates to the deposition of dielectric layers in the manufacturing of semiconductor thin films. More specifically, this invention relates to the deposition of oxide dielectric thin films at temperatures near or below room temperature. Additionally, this invention relates to the manufacture of diffusion barriers to prevent food oxidation, and barriers to the transmission of ultraviolet radiation to increase the shelf life of food products.

2. Description of Related Art

Conventional methods for depositing dielectric materials such as $SiO_2$ in semiconductor manufacture involve high temperature chemical vapor deposition (CVD), spin-on-glass (SOG) methods, rf magnetron sputtering, (Kollakowski et al., *Vac. Sci. Technol. B.* 14(3):1712–1718 (1996); Jones, U.S. Pat. No. 3,442,686, evaporation (Lucovsky et al. *Thin Film Processes II*, Eds. J. L. Vossen & W. Kern, Academic Press, NY, pp: 565 (1991), and plasma processes (Wen-Fa et al. *Appl. Surf. Sci.* 99:237–243 (1996); Lee et al., *J. Electrochem. Soc.* 143(4):1443–1451)1996); Plais et al. *J. Electrochem. Soc.* 139(5):14989–14995 (1992); Sano et al., *Mat. Res. Soc. Symp. Proc.* 396:539–543 (1996); Decrosta et al., *J. Electrochem. Soc.* 143(3):1079–1084 (1996); Samit et al., *Adv. Mat. Optics Electron* 6:73–82 (1996)).

Moreover, in the food packaging industry, oxide films have been used to provide oxidant barriers and ultraviolet barriers to retard spoilage. However, the plasma methods used to deposit $SiO_2$ or $TiO_2$ have several disadvantages.

However, each of these processes has major drawbacks in the manufacture of semiconductor devices of sub-micron dimensions. Spin-on-glass processes result in relatively uneven films. Moreover, spin-on glass has high impurity levels and poor gap filling abilities. This results in inherent problems with device reliability. The other methods described all suffer from problems associated with exposing the substrate to high temperatures or high powered plasmas. Subjecting the substrate to the temperatures required for conventional CVD, plasma, or rf magnetron sputtering can cause the breakdown of thermally labile components of the semiconductor devices. Moreover, as newer low dielectric materials with lower thermal stability are being used, the maximum temperatures to which semiconductor devices can be subjected during manufacture decreases. Because $SiO_2$ and other oxide dielectrics confer desirable properties of dielectric layers, such as thermal stability, mechanical strength, low impurity, good adherence to substrates and good barrier to impurities, there is a need to develop methods for the low-temperature deposition of oxide dielectric materials in semiconductor manufacture.

To be compatible with the low dielectric constant polymer materials, the $SiO_2$ must be deposited at low temperatures, less than the glass transition temperature (Tg) of polymers. Also, to minimize stress between films, which can cause delamination, and introduce charges at the interface, the films should all be deposited at the same temperatures. The interface charges introduce electronic signal degradation which defeats the purpose of using low dielectric constant materials to minimize cross-talk.

One type of method for the low temperature deposition of $SiO_2$ is via remote dissociation and deposition. In this process, the precursor for the dielectric material is subjected to dissociating conditions in which reactive intermediates are generated. The intermediates are then transported to another site, where the intermediates can react with each other to form a thin film on the semiconductor substrate. One proposal for remote formation of a relative long-lived reactive intermediate was for a —Si—H and was called HOMOCVD (Scott et al., *Semiconductors and Semimetals*, Vol. Ed. J. I. Pankove, Academic Press, Boston, Vol. 21A: 123–49 (1984). However, this method is not appropriate for the deposition of oxides, possibly due to high hydrogen content in the films leading to reduced reliability.

To overcome the deficiencies in the prior art, one object of this invention is the manufacture of oxide dielectric materials with high mechanical and thermal stability, high dielectric strength, and high transparency to visible electromagnetic radiation.

Another object of this invention is the manufacture of oxide dielectric materials at temperatures near room temperature.

A further object of the invention is the high efficiency deposition of oxide dielectric films from organometallic precursors.

Yet another object of this invention is the manufacture of integrated circuit chips using oxide dielectric films deposited at near or below room temperature.

A further object of this invention is the manufacture of low-temperature oxide films to reduce the diffusion of oxidants and reduce the transmission of ultraviolet light into food products.

SUMMARY OF THE INVENTION

This invention involves the use of remote thermal dissociation of organometallic precursors to deposit oxide films at a site remote from the site of dissociation. Organometallic precursors can be thermally dissociated at high-temperatures into long-lived reactive intermediates and can be transported to a remote site for near-room temperature deposition and polymerization on a substrate, thereby forming a thin film of the oxide polymer. The substrate can be maintained at a temperature well below that needed for efficient dissociation of precursors. The films deposited using the methods of this invention have unexpectedly low leakage currents, based on the prior art films made using conventional, high-temperature deposition methods.

Thus, one aspect of this invention is the use of alkoxysilane precursors to generate reactive intermediates with a sufficiently low activation energy to form high quality $SiO_2$ thin films.

A further aspect of this invention is the manufacture of oxide dielectric thin films deposited at near room temperature.

Yet another aspect of this invention is the regulation of the physical properties of the oxide film by controlling the conditions of deposition.

A further aspect of this invention is the regulation of the chemical properties of the oxide film by controlling the conditions of deposition.

Another aspect of this invention is the regulation of the electrical properties of the oxide film by controlling the conditions of deposition.

A yet other aspect of this invention is the regulation of the optical properties of the oxide film by controlling the conditions of deposition.

Another aspect of this invention is the manufacture of semiconductor devices incorporating the oxide dielectric materials deposited at near or below room temperature.

A further aspect of this invention is the manufacture of low-temperature oxide films which inhibit the diffusion of oxidants and the transmission of ultraviolet light for food packaging.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE INVENTION

Figure 1:
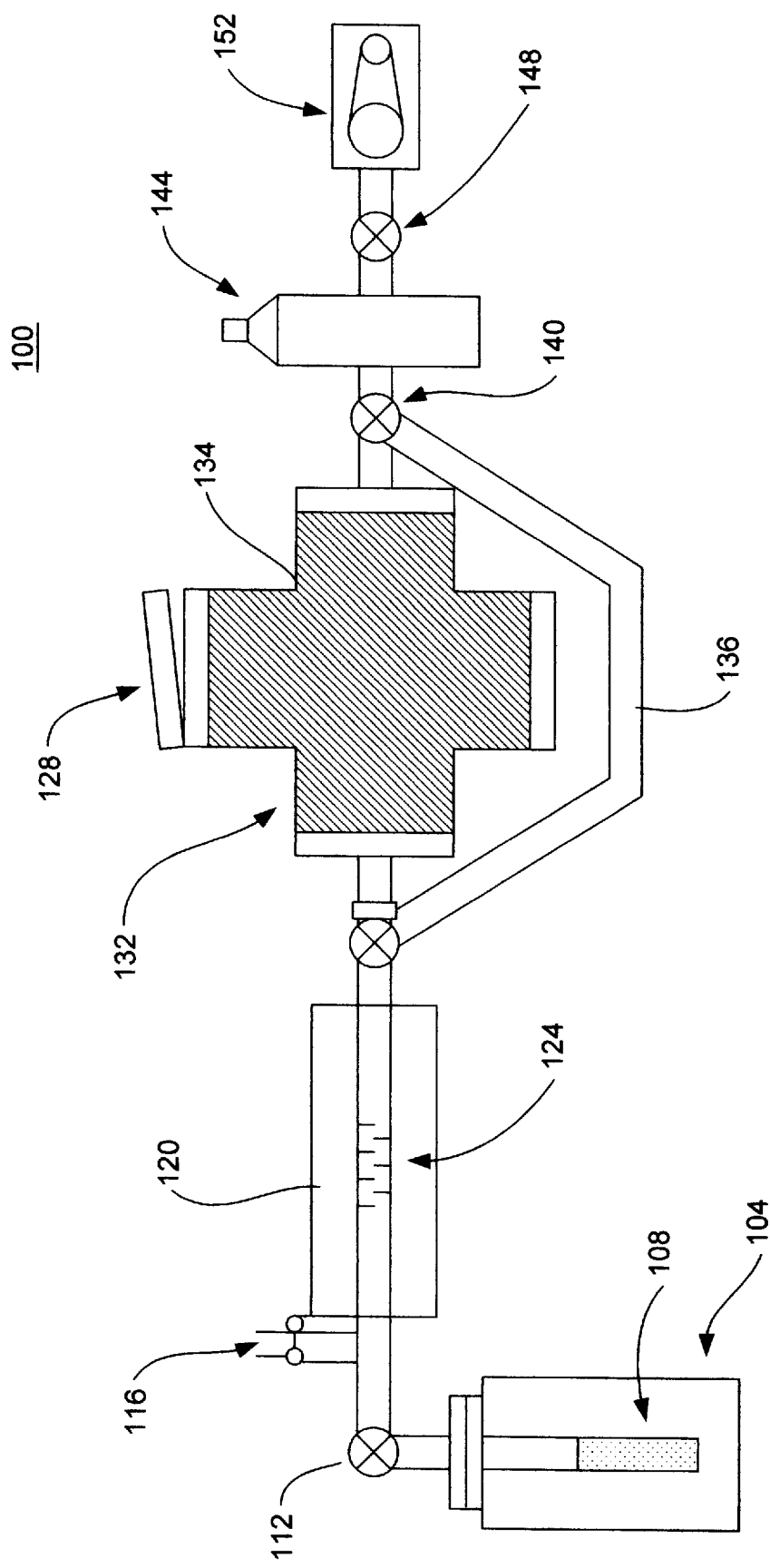
FIG. 1 is a schematic diagram of the apparatus used for low temperature thermal chemical vapor deposition of $SiO_2$ films of the invention.

To overcome the deficiencies in the prior art, this invention involves methods for the manufacture of oxide dielectric films to provide electrical insulation of semiconductor devices. The oxide films can exhibit low leakage currents and thereby provide better long-term electrical properties than films made using conventional methods. The oxide films also can act as suitable interfaces between low dielectric constant materials, underlying metal and $SiO_2$ layers as a barrier to possible impurities in the low dielectric constant materials. These oxide materials are also used as barriers to the contamination of polymers by external moisture absorption. The oxide layers can also be used as cap layers over polymer layers and can be used in the manufacture of multilayered films comprising oxide layers and layers of organic polymers. Multilayered films are described in copending United States Patent Application titled: "Oxide/Organic Polymer Multilayer Thin Films Deposited by Chemical Vapor Deposition." Inventors: S. Desu et al, filed concurrently (herein incorporated fully by reference).

The methods presented here involve a thermal chemical vapor deposition (CVD) process starting with common alkoxy precursors, by way of example only, diacetoxy-di-t-butoxysilane (DADBS) and tetraethoxysilane (TEOS). The method is general and can be applied to the formation of other oxides, such as by way of example only, $Al_2O_3$, $Y_2O_3$, $TiO_2$, $ZrO_2$, $Ta_2O_5$, $Nb_2O_5$, and ZnO.

I. Chemical Reactions

The method of this invention may be explained by the following two-step reaction sequence:

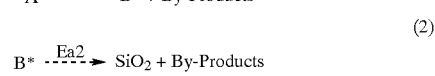

Here, A is the alkoxy precursor (for example, DADBS or TEOS), and B* is the relatively long-lived intermediate species. $SiO_2$ can be deposited at near and below room temperatures for at least two reasons. First, a relatively long-lived intermediate species can be formed through reaction (1), which can then be transported to another chamber at near-room temperature where reaction (2) can take place. Second, the activation energy for reaction (2) Ea2 can be small, in the range of about 1 eV, since a large activation energy for reaction (2) can prohibit formation of a near-room temperature product (Adamson, *Physical Chemistry of Surfaces*, John Wiley & Sons, New York pp. 595 (1990)). This invention relies on physically separating reactions (1) and (2) to permit deposition of $SiO_2$ at temperatures near room temperature.

The mechanisms for reaction 1 are not known with certainty, but one theory proposed by Hoffman, et al. (*Thermochimica Acta*. 215:329–335 (1993)), is that the pyrolytic decomposition of DADBS can occur by the formation of a six-ringed cyclic intermediate before the production of acetic anhydride at temperatures above about 200° C. A similar mechanism was proposed by Ashby et al. for metal alkosides (Ashby et al., *J. Org. Chem.* 44(8):1221–1232 (1979)). At a pyrolysis temperature T>400° C., 2-methylpropene has been proposed to form by a β-hydride elimination mechanism. Both reactions would be inclusive in reaction (1). The net-intermediate was proposed as silicon acid. According to this theory, silicon acid then undergoes a polycondensation reaction (according to Hofman, et al.) thus producing $H_2O$ as a by-product and forming an amorphous network of $SiO_2$. However, there are other possible theories to account for the observations, and this invention is not limited by any particular theory of operability.

Many different dielectric materials can be used to make the oxide layers of this invention. In general, it can be desirable that the oxide polymer have high thermal and mechanical stability, and that the precursor be dissociable into reactive intermediates which can be transported in the gas phase, and which can polymerize on semiconductor substrates at temperatures below the glass transition temperatures of any organic phase polymers used in semiconductor manufacturing. Generally, any oxide can be deposited using the methods of this invention in which the oxide precursor has one of the following general formulae:

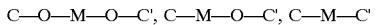

where M is a metal atom, O is an oxygen atom, and C and C' are organic moieties. Typically, oxides suitable for forming films of this invention include silicates such as $SiO_2$, or other oxides such as $Al_2O_3$, $Y_2O_3$, $TiO_2$, $ZrO_2$, $Ta_2O_5$, $Nb_2O_5$, or ZnO. This list is by way of example only and is not intended to be limiting.

Typical precursors for the deposition of $SiO_2$ include alkoxysilane precursors, DADBS ($C_{12}H_{24}O_6Si$), TEOS ($C_8H_{20}O_4Si$), tetraacetoxysilane ($C_8H_{12}O_8Si$), tetramethoxysilane (TMOS), tetraallyloxysilane ($C_{12}H_{20}O_4Si$), tetra-n-butoxysilane ($C_{16}H_{36}O_4Si$), tetrakis(ethoxyethoxy)silane ($C_8H_{36}O_8Si$), tetrakis(2-ethylhexoxy)silane ($C_{32}H_{68}O_4Si$), tetrakis(2-methoxycryloxyethoxy)silane ($C_{24}H_{36}O_{12}Si$), tetrakis(methoxyethoxyethoxy)silane ($C_{20}H_{44}O_{12}Si$), tetrakis(methoxyethoxy)silane ($C_{12}H_{28}O_8Si$), tetrakis(methoxypropoxy)silane ($C_{16}H_{36}O_8Si$), and tetra-n-propoxysilane ($C_{12}H_{28}O_4Si$).

Typical precursors for the deposition of other metal oxides include, by way of example only, aluminum (III) n-butoxide, yttrium isopropoxide, titanium-di-n-butoxide (bis-2,4-pentanedionate), zirconium isopropoxide, tantalum (V) n-butoxide, niobium (V) n-butoxide, and zinc n-butoxide.

II. Methods for Deposition of Oxide Films at Low Temperatures

The processes of this invention can be carried out using a custom-built modified CVD reactor as exemplified by FIG. 1. The CVD reactor 100 has separate vaporization, pyrolysis, and deposition chambers. The precursor (by way of example only, DADBS or TEOS) 108 is placed in a vaporization chamber 104. The precursor is vaporized and the vaporized precursor passes through a valve 112 and thereafter into pyrolysis chamber 120, containing baffles 124. The pyrolysis chamber 120 is heated using any convenient means, including by way of example only, a resistive heater. The dissociation of precursors into reactive intermediates can take place in the pyrolysis chamber at temperatures in the range of from about 400° C. to about 800° C., alternatively from about 550° C. to about 750° C., and in other embodiments at about 630° C. to about 650° C. for DADBS and about 680° C. for TEOS. The flow of precursors and reactive intermediates can be regulated by the rate of vaporization of the precursor, which is controlled by the temperature of the vaporizer 108, or by the flow of a carrier gas through the inlet port 116.

After dissociation of precursors, the reactive intermediates pass into deposition chamber 132 which can contain a clamp to hold a substrate for oxide deposition (not shown). Substrates that can be used for deposition are, by way of example only, Si(111), which is suitable for optical characterization of the deposited films, or thermal oxide. These substrates can then be cleaned using any convenient means, including, by way of example only, a modified RCA cleaning procedure consisting of sequential cleaning in heated solutions of $NH_4OH$, $H_2SO_4$ and HCl combined with $H_2O_2$, to remove surface contaminants and additionally cleaned with 10% HF for 60 seconds.

The wafer can be introduced into the chamber 132 by way of a door 128. The temperature of the deposition chamber 132 can be maintained using any convenient means, including, by way of example only, an ethylene glycol/water mixture flowing through copper tubing 134. Deposition temperatures can range from about 40° C. to about 170° C., alternatively from about 60° C. to about 100° C., and in other embodiments from about 70° C. to about 90° C.

The pressure in the deposition chamber can range from about 0.01 Torr to about 1.0 Torr, alternatively from about 0.03 Torr to about 0.2 Torr, and in other embodiments from about 0.05 Torr to 0.1 Torr. The flow rate of reactive intermediates into the deposition chamber can be regulated by the temperature of vaporization of the precursor and/or by the flow rate of the carrier gas, which can be, by way of example only, nitrogen, argon or oxygen. When precursors having a metal atom bonded directly to a carbon atom are used, as in precursors having the structural formulae: C—M—O—C' or C—M—C', it can be desirable to use oxygen in the precursor stream. Oxygen can be a reactive molecule to aid in the dissociation of precursors, and can become part of a reactive intermediate moiety. Flow rates of gas and precursors can be in the range of from about 1 standard cubic centimeter per minute (SCCM) to about 1000 SCCM, alternatively from about 10 SCCM to about 100 SCCM, and in other embodiments at about 20 SCCM.

Figure 2:
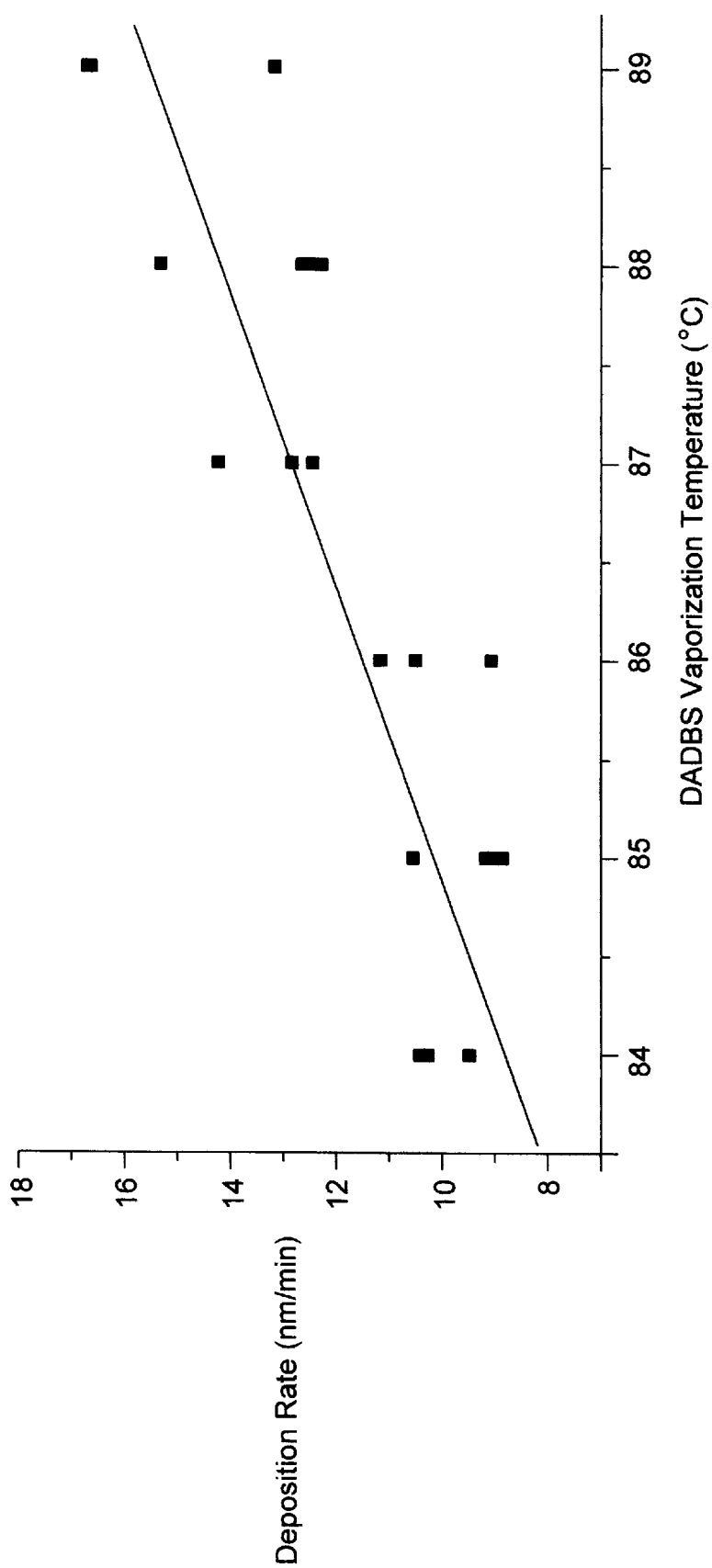
FIG. 2 shows the relationship between DADBS vaporization temperature and deposition rate for $SiO_2$ thin films.

Depositions can be carried out for a sufficient time to deposit a film of desired thickness. The rate of deposition of $SiO_2$ can depend on the vaporization temperature and upon the rate of flow of carrier gas from the vaporization chamber to the deposition chamber. FIG. 2 shows the relationship between the vaporization temperature of DADBS and the rate of deposition of a thin film of $SiO_2$. At a vaporization temperature of about 84° C., the rate of deposition is about 10 nm/min, whereas at a vaporization temperature of about 89° C., the rate of deposition is about 15 nm/min.

The rate of deposition of $SiO_2$ from DADBS can be in the range of from about 1 nm/min to about 200 nm/min, alternatively from about 5 nm/min to 200 nm/min, and in other embodiments from about 7 to 15 nm/min. Rate of deposition of $SiO_2$ from TEOS can be in the range of from about 1 nm/min to about 200 nm/min, alternatively from about 5 nm/min to about 200 nm/min, and in other embodiments from about 5 nm/min to about 10nm/min.

III. Methods for Characterizing Oxide Films

The thickness and optical characterization of oxide films can be accomplished by using any convenient means, including, by way of example only, a variable angle spectroscopic ellipsometer (VASE) from J. A. Woollam Company. The wavelength of light used can be in the range of from about 300 nm to about 1000 nm, and measurements can typically be performed at several angles normal to the sample, for example, at 70°, 75° and 80°. A Cauchy model can be used to calculate film thickness, the dispersion curves for the index of refraction and extinction coefficient for the films.

Infrared spectra can be obtained using a Nicolet FTIR device with reflection attachment used at an angle of about 10° normal to the surface.

Electrical properties of oxide films such as $SiO_2$, including the dielectric constant and dielectric loss can be obtained using standard methods in the art. By way of example, impedance measurements can be made using a Solarton SI 1260 Impedance Analyzer. An alternating voltage of about 50 mV can be applied to the sample. A top electrode made out of platinum can be deposited onto the shadow masked $SiO_2$ deposited film by a DC magnetron sputter coating device. The platinum electrodes can have an area of between about $4.26 \times 10^{-4}$ $cm^2$ and about $9.62 \times 10^{-4}$ $cm^2$. The bottom electrode can be a highly doped p-type polycrystalline silicon.

For measurement of leakage current, electrical resistivity and dielectric breakdown, $SiO_2$ films can be grown on thin films of titanium, which can be sputter coated onto Si(100) substrates using a DC magnetron sputtering device. The top electrode can be made out of platinum, and can be deposited onto the shadow masked $SiO_2$ film by a DC magnetron sputtering device. Results can be obtained using a Hewlett Packard model 4140B pico amp/DC voltage source. A voltage of 1 MV/cm can be used to measure the leakage current for each $SiO_2$ film and generally the leakage current stabilizes in less than about five minutes.

Films deposited using these low temperature deposition methods can have the desired characteristics of films deposited by conventional CVD methods. The film thickness, purity, refractive index, chemical composition, bonding structures, and electrical properties of films deposited at near or below room temperature compare favorably with those of $SiO_2$ films made using DADBS or TEOS and deposited at higher temperatures, for example at about 400° C.

The films of this invention, made with, by way of example only, $TiO_2$, can inhibit the transmission of ultraviolet light. By inhibiting the transmission of harmful ultraviolet light through food packaging materials, the spoilage rates can be decreased and the shelf life of food products can be increased. Furthermore, oxide films made using $SiO_2$, by way of example only, can act as barriers to the diffusion of oxidants such as $O_2$. By decreasing the diffusion of oxidants through food packaging products, the oxidation of food products can be decreased and the shelf life can be increased.

The invention may be further understood by reference to the following Examples.

EXAMPLES

Example 1

Chemical Characterization of $SiO_2$ Films

Figure 3:
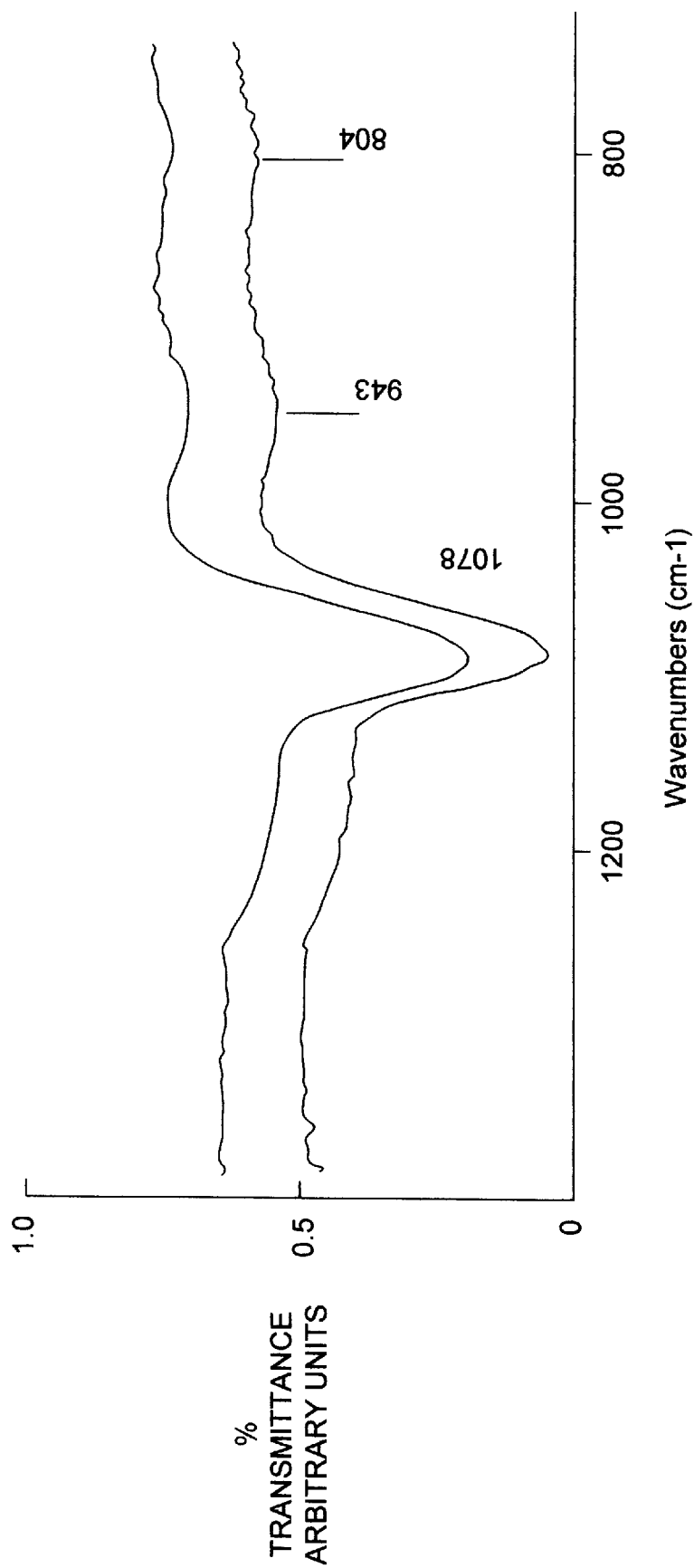
FIG. 3 shows the infrared spectra of $SiO_2$ films deposited from DADBS and TEOS determined at wavenumbers from about 750 $cm^{-1}$ to about 1300 $cm^{-1}$.

Characterization of the chemical composition and bonding structures were determined by Fourier Transformed Infrared spectral analysis (FTIR). FIG. 3 shows the Reflection-FTIR spectra of $SiO_2$ deposited at 81° C. from DADBS (bottom trace) and from another film of $SiO_2$ deposited at 66° C. from TEOS (top trace). Both spectra were obtained using a reflection angle of 10°. The films produced by the methods of the invention are highly pure and free of contamination by organic material. The two spectra shown in FIG. 3 are nearly identical and only three absorption peaks are present, at wavenumbers of 1078 $cm^{-1}$, 943 $cm^{-1}$ and 804 $cm^{-1}$. The peaks observed at about 1078 $cm^{-1}$ are known in the art to be due to the broad asymmetrical stretch of Si—O—Si and the peaks observed at 804 $cm^{-1}$ are known in the art to be due to the symmetrical Si—O—Si stretch. The peaks observed at 1078 $cm^{-1}$ are also called the transverse optical (TO) mode and is known in the art to result from the oxygen atom stretching parallel to Si—O—Si (Lee et al., *J. Electrochem. Soc.* 143(4):1443–1451 (1996)). The peak can be deconvoluted into three separate peaks. In the case of TEOS, peaks can be observed at about 1024 $cm^{-1}$ to about 1052 $cm^{-1}$, about 1071 $cm^{-1}$ to about 1093 $cm^{-1}$ and about 1123 $cm^{-1}$ to about 1177 $cm^{-1}$ (Goullet, et al., *J. Appl. Phys.* 74:6876 (1987), where the highest wave number broad peak can create the characteristic asymmetrical hump. This hump can result from either non-stoichiometry ($SiO_x$ where X<2) or broken Si—O bonds due to hydrolysis, which can shift the net peak to lower wavenumbers (Lee et al., *J. Electrochem. Soc.* 143(4): 1443–1451 (1996); Pai et al., *J. Vac. Sci. Technol.* 4(3): 689–694 (1986); Almeida et al., *J. Appl. Phys.* 68: 4225 (1990)). In the present study, the highest wave number peak is at about 1150 $cm^{-1}$ and is can be due to a non-stoichiometry since the composite peak is not shifted to lower wave numbers. The rather small peak observed at 943 $cm^{-1}$ can be due to Si—OH bonding, indicating the presence of only small amounts of hydroxylated moieties on the surface.

Figure 4:
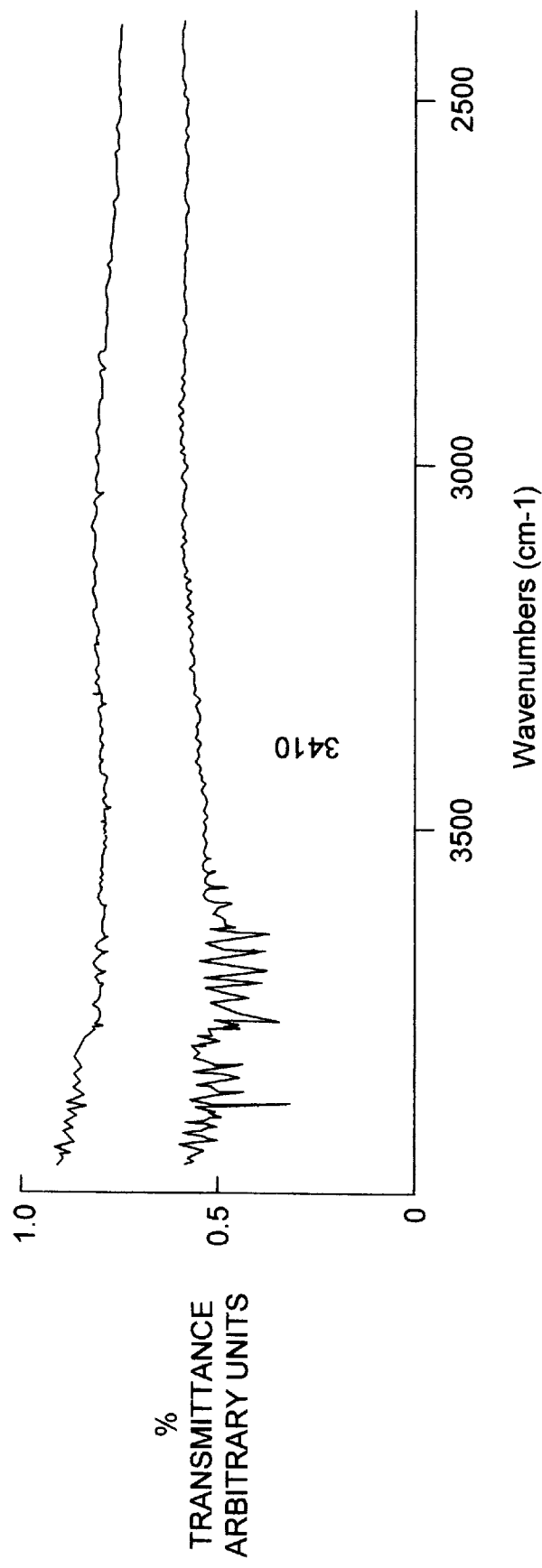
FIG. 4 shows the infrared spectra of $SiO_2$ films deposited from DADBS and TEOS determined at wavenumbers from about 2400 $cm^{-1}$ to about 4000 $cm^{-1}$.

Additionally, films can be made having little water present. FIG. 4 shows the Reflection-FTIR spectra of $SiO_2$ films deposited from either TEOS (top trace) and DADBS (bottom trace) at wave numbers of about 2400 $cm^{-1}$ to about 4000 $cm^{-1}$. Water present in films can generate a broad peak observed at about 3410 $cm^{-1}$ due to the —OH stretch within the water molecule. However, as can be seen in FIG. 4, there is no detectable peak at near 3410 $cm^{-1}$. We therefore conclude that little, if any, water is present in the films.

Furthermore, little, if any Si—O—C or Si—C bonding was observed in the films. This conclusion is based on the absence of peaks that are characteristic of these types of bonds as observed in the FTIR spectra. Ether linkages (—C—O—) can appear as peaks at wavenumbers of about 1050 $cm^{-1}$ to about 1180 $cm^{-1}$. Si—C bonds absorb IR radiation at wavenumbers of about 700 $cm^{-1}$ to about 860 $cm^{-1}$, and at about 1230 $cm^{-1}$ to about 1280 $cm^{-1}$ (Wade, *Organic Chemistry*, Prentice Hall, New Jersey (1991)). Therefore, the absence of peaks at these wavenumbers can mean that little carbon contaminants are present in the films.

Furthermore, results from x-ray photoelectron spectroscopy (XPS) show an atomic ratio of 1 atom of silicon to 2.1 atoms of oxygen. Thus, stoichiometrically pure $SiO_2$ films were grown without the incorporation of by-products or the precursors.

The above possible mechanisms accounting for the patterns of peaks are presented only as theories to explain the observations. Other theories may also explain the observations, and this invention is not limited to any particular theory for operability.

Example 2

Physical Characteristics of $SiO_2$ Films

Film thickness can be a function of the deposition rate and the time of deposition, However, there can be a dependence of film thickness on precursor concentration at certain temperature ranges. By way of example only, a film of $SiO_2$ was deposited from DADBS at vaporization temperatures of about 84° C. to about 89° C. FIG. 2 shows that at the lower vaporization temperatures, the rate of deposition of $SiO_2$ was about 10 nm/min, whereas at higher vaporization temperatures, the deposition rate was about 15 nm/min.

A theory to possibly explain this observation is that at these temperatures the deposition of $SiO_2$ surface is under mixed diffusion and surface reaction control. At lower temperatures the surface effects can predominate, and at higher temperatures the diffusion effects can predominate. By way of example only, for DADBS deposited at a temperature of about 70° C., the nature of the substrate surface can affect the deposition rate and quality of the $SiO_2$ thin film. However, this is only a possible theory to account for the observations, and other theories may account for the observations.

Figure 5:
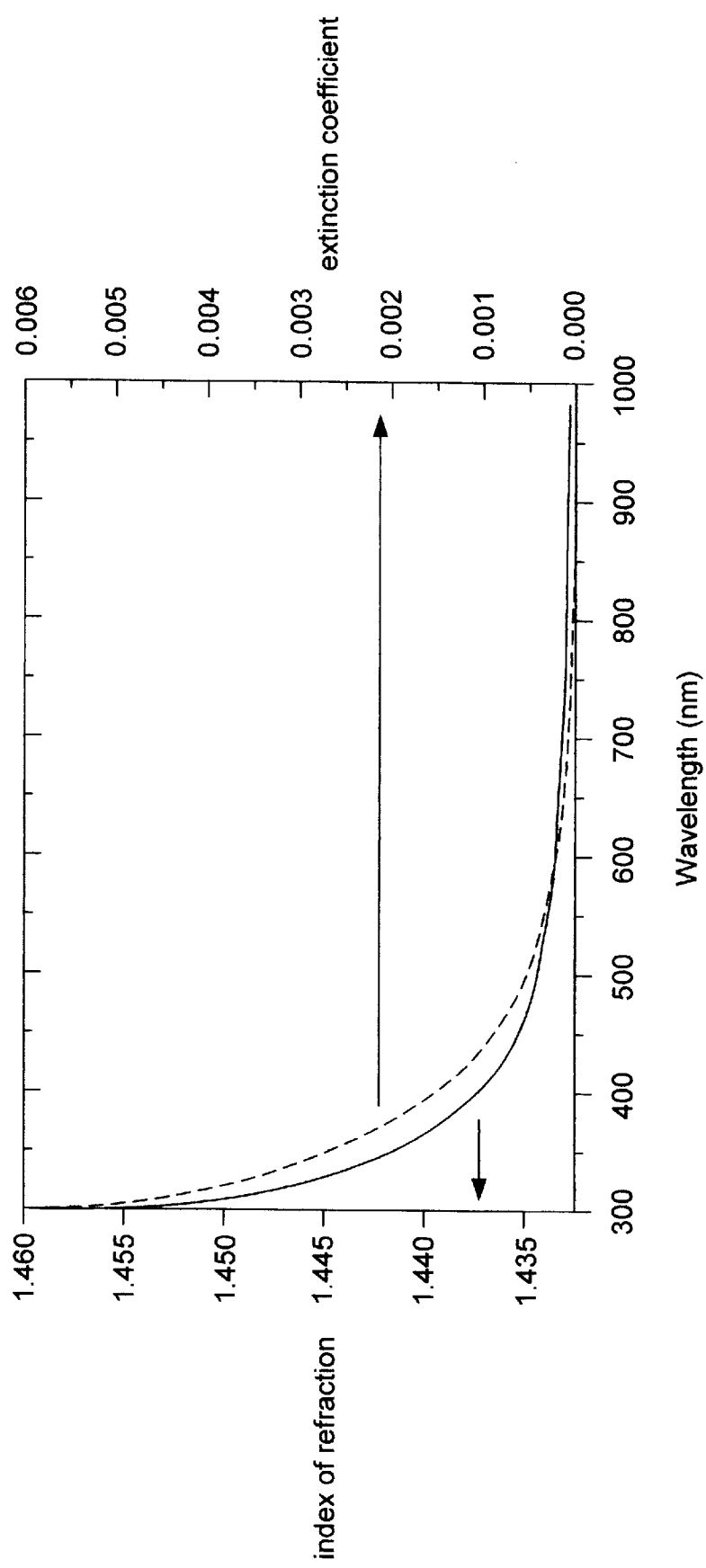
FIG. 5 shows the relationships between index of refraction (solid graph) and extinction coefficient (broken graph) and wavelength of incident light of wavelengths from 300 nm to 1000 nm.

The density of the $SiO_2$ film can be determined from measurements of the refractive index of the film. FIG. 5 shows that the average index of refraction, as measured by VASE, was 1.433 (@ 630 nm), which is only slightly lower than the other published value for $SiO_2$ (1.44) using DADBS as a precursor (Smolinsky, *Mat. Res. Soc. Symp. Proc.* 390:490–496 (1986)). The index of refraction varied from 1.425 to 1.439 and was not a function of the vaporization temperature. Thus, the density of the $SiO_2$ films deposited at near room temperature is comparable to $SiO_2$ films deposited at higher temperatures.

The dispersion of the index of refraction flattens around 630 nm but below that wavelength it varies from 1.433 @ 630 nm to 1.460 @ 300 nm. This rapid increase can be due to relative closeness of the $SiO_2$'s absorption edge to its band gap of about 9.0 eV. The observed dispersion is typical of a transparent thin film or material with a relatively large band gap of greater than about 3.0 eV.

The extinction coefficient was determined to be dependent on the wavelength of electromagnetic radiation used to make the measurements. At high wavelengths, characteristic of infrared light (about 1000 nm), the extinction coefficient was about $7.05 \times 10^{-5}$. The extinction coefficient measured at about 630 nm was observed to be about $2.10 \times 10^{-4}$. When measured at about 300 nm (corresponding to ultraviolet light), the extinction coefficient was observed to be about $5.41 \times 10^{-3}$. Thus, the films of this invention have low ultraviolet transmittance, making them suitable for use as barriers to the transmission of ultraviolet electromagnetic radiation. A low extinction coefficient measured at wavelengths higher than ultraviolet is typical for $SiO_2$ thin films. It is known that increased porosity can increase the extinction coefficient. Typically however, no optical loss is associated with thermally grown $SiO_2$.

Example 3
Electrical Properties of $SiO_2$ Films

To measure electrical properties of $SiO_2$ films, we carried out observations on films having a thickness of about 25 nm deposited on titanium-coated substrates from DADBS. The films were deposited according to the methods described above and were deposited at temperatures in the range of from about 60° C. to about 90° C. Measurements of the electrical properties of the films were determined as described above and shown in Table 1.

TABLE 1

Electrical Properties of $SiO_2$ Films Deposited at Low Temperature

| | |
|---|---|
| K @ 1 kHz | 4.26 |
| Dielectric loss at 1 kHz | 0.0257 |
| Dielectric breakdown | 7.2 MV/cm |
| Leakage current @ 1 MV/cm | $1.8 \times 10^{-10}$ A/cm$^2$ |
| Electrical resistivity @ 1 MV/cm | $1.1 \times 10^{13}$ Ω cm |

The dielectric constant for $SiO_2$ films of this invention of 4.26 is close to other reported values for films of $SiO_2$ deposited from alkoxy precursors using CVD methods. The $SiO_2$ films showed a higher dielectric loss measured at 1 kHz than $SiO_2$ films deposited at higher temperatures. A theory to possibly account for this observation is related to the nature of the polycrystalline silicon substrate and the orientational polarization due to Si—OH bonding. However, other theories may account for this observation.

The dielectric breakdown voltage was measured to be about 18 V, which normalized for the thickness of the film, was 7.2 MV/cm. This value corresponds well with values reported previously for $SiO_2$ films deposited at higher temperatures (Lee, et al., *J. Electrochem. Soc.* 143(4):1443–1451 (1996); Samit et al., *Adv. Mat. Optics Electron.* 6:73–82 (1996)).

The leakage current was measured at 1.0 MV/cm, corresponding to a thickness-normalized voltage of 2.5 V. The leakage current observed under these conditions of $1.8 \times 10^{-10}$ A/cm$^2$ for the films of this invention was unexpectedly lower than the published values of $8 \times 10^{-9}$ A/cm$^2$ to $10^{-7}$ A/cm$^2$ observed for films made using conventional, high-temperature methods (Smolinsky, *Mat. Res. Soc. Symp.* 390:490–496 (1986)). This result was completely unexpected based on the publication of Smolinsky. A theory which may account for this observation is that the presence of even small amounts of Si—OH bonding as observed in the infrared spectra (FIG. 3) can increase the leakage current slightly (Smolinsky, *Mat. Res. Soc. Symp.* 390:490–496 (1986)). Thus, by decreasing the amount of water in the deposited film, there can be fewer Si—OH bonds in the film, and therefore, the leakage current can be decreased. However, other theories may account for the observations, and this invention is not intended to be limited by any particular theory for operability.

Additionally, the observed electrical resistivity of $1.1 \times 10^{13}$ Ω cm was similar to that observed for $SiO_2$ films deposited at higher temperatures.

The films deposited using the methods of the present invention have unexpectedly better electrical properties than films made using conventional, high-temperature methods. Thus, the chemical, physical, and electrical properties of the $SiO_2$ films of this invention are comparable to or are better than those observed for $SiO_2$ films deposited from alkoxysilane precursors at higher temperatures.

Unless otherwise incorporated by reference, all articles and patents cited herein are incorporated herein fully by reference.

The foregoing description and examples are intended to be illustrative only, and are not intended to be limiting to the scope of the invention.

INDUSTRIAL APPLICABILITY

Oxide films are deposited at low temperature and are useful in the manufacture of semiconductor devices and in the food packaging industry in which the advantages of conventional oxide materials and conventional organic polymeric materials can be attained in one thin film. In the semiconductor industry, low-temperature oxide films are useful for the manufacture of dielectric thin films in which other components of the films cannot be subjected to high temperatures. In the food packaging industry, low-temperature oxide films are useful to inhibit the diffusion of oxidants and the transmission of ultraviolet light into food products. By decreasing the contamination and light-induced damage, food products can have improved quality and shelf-life.

What is claimed is:

1. A method for forming an oxide film on a substrate comprising the steps of:
    (a) vaporizing an oxide precursor selected from the group consisting of aluminum (III) n-butoxide, yttrium isopropoxide, titanium-di-n-butoxide (bis-2,4-pentanedionate), zirconium isopropoxide, tantalum (V) n-butoxide, niobium (V) n-butoxide and zinc n-butoxide;
    (b) dissociating the vaporized precursor at a temperature in the range of about 400° C. to about 800° C.; and
    (c) polymerizing the dissociated, vaporized precursor on the substrate at a temperature below about 300° C.

2. The method of claim 1, wherein the deposition temperature is in the range of about 40° C. to about 170° C.

3. The method of claim 1, wherein said step of dissociating said precursor is carried out using a resistive heater.

4. The method of claim 1, wherein the step of dissociating said oxide precursor is carried out at a temperature in the range of about 550° C. to about 750° C.

5. The method of claim 1, wherein the step of dissociating said oxide precursor is carried out at a temperature in the range of about 630° C. and about 650° C.

6. The method of claim 1, wherein the step of polymerizing is carried out at a pressure in the range of about 0.01 Torr to about 1.0 Torr.

7. The method of claim 1, wherein the step of polymerizing is carried out at a pressure in the range of about 0.03 Torr to about 0.2 Torr.

8. The method of claim 1, wherein the step of polymerizing is carried out at a pressure in the range of about 0.05 Torr to about 0.1 Torr.

9. The method of claim 1, wherein the precursor is transported to a dissociation chamber using a carrier gas.

10. The method of claim 1, wherein said carrier gas is selected from the group consisting of nitrogen, argon and oxygen.

11. The method of claim 1, wherein the oxide precursor is transported at a flow rate in the range of about 1 SCCM to about 1000 SCCM.

12. The method of claim 1, wherein the oxide precursor is transported at a flow rate in the range of about 10 SCCM to about 100 SCCM.

13. The method of claim 1, wherein the oxide precursor is transported at a flow rate of about 20 SCCM.

14. The method of claim 1, wherein said step of polymerizing is carried out at a deposition rate of about 1 nm/min to about 200 nm/min.

* * * * *